(12) United States Patent
Pijolat (10) Patent No.: US 8,431,031 B2
(45) Date of Patent: Apr. 30, 2013

(54) METHOD FOR PRODUCING A BULK WAVE ACOUSTIC RESONATOR OF FBAR TYPE

(75) Inventor: Mathieu Pijolat, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 124 days.

(21) Appl. No.: 12/960,475

(22) Filed: Dec. 4, 2010

(65) Prior Publication Data

US 2011/0132866 A1 Jun. 9, 2011

(30) Foreign Application Priority Data

Dec. 4, 2009 (FR) ...................................... 09 05874

(51) Int. Cl.
*H01B 13/34* (2006.01)
(52) U.S. Cl.
USPC .......................................................... 216/13
(58) Field of Classification Search ................. 216/13; 333/133, 187; 73/592
See application file for complete search history.

(56) References Cited

U.S. PATENT DOCUMENTS

| | | | |
|---|---|---|---|
| 6,767,749 B2 | 7/2004 | Kub et al. | |
| 2003/0199105 A1 | 10/2003 | Kub et al. | |
| 2005/0262944 A1* | 12/2005 | Bennett et al. | 73/592 |
| 2007/0115078 A1* | 5/2007 | Sano et al. | 333/187 |
| 2007/0200458 A1 | 8/2007 | Yoshino et al. | |
| 2007/0210878 A1 | 9/2007 | Yamaguchi et al. | |

OTHER PUBLICATIONS

Yukihisa Osugi, et al., "Single Crystal FBAR with LiNbO3 and LiTaO3 Piezoelectri Substance Layers", Microwave Symp., 2007, pp. 873-876.
M Pijolat, et al., "Large Qxf Product for HBAR using Smart Cut TM transfer of LiNbO3 thin layers onto LiNbO3 substrate", 2008 IEEE International Ultrasonics Symposium Proceedings, 2008, pp. 201-204.
J.S. Moulet, et al, "High piezoelectric properties in LiNbO3 transferred layer by the Smart Cut TM technology for ultra wide band BAW filter applications", IEEE IEDM, 2008, 4 pages.
M. Pijolat, et al., "Mode conversion in High overtone Bulk Acoustic wave resonators", IEEE Freq. Contr. Symp., 2009, pp. 290-294.
M. Bruel, "Silicon on Insulator Material Technology", Electronics Letters, IEE Stevenage, Jul. 6, 1995, pp. 1201-1202, vol. 31, No. 14, XP006003062.

\* cited by examiner

*Primary Examiner* — Nadine Norton
*Assistant Examiner* — Mahmoud Dahimene
(74) *Attorney, Agent, or Firm* — Baker Hostetler LLP (57) ABSTRACT

A method for fabricating a bulk wave acoustic resonator (FBAR) which includes at least locally a partially suspended thin layer of piezoelectric material, and includes the following steps: the formation of at least one first so-called lower electrode on the surface of a thin layer of piezoelectric material; the deposition of a so-called sacrificial layer on the surface of the said thin layer of piezoelectric material and of the said first electrode defining a first set; the assembling of the said first set with a second substrate; the formation of at least one second electrode termed the upper electrode on the opposite face of the said thin layer of piezoelectric material from the face comprising the said first electrode; and the elimination of the sacrificial layer so as to unveil the said thin layer of piezoelectric material and the said first electrode and define the bulk wave resonator.

23 Claims, 5 Drawing Sheets

METHOD FOR PRODUCING A BULK WAVE ACOUSTIC RESONATOR OF FBAR TYPE

CROSS-REFERENCE TO RELATED APPLICATION

This application claims priority to foreign French patent application No. FR 0905874, filed on Dec. 4, 2009, the disclosure of which is incorporated by reference in its entirety.

FIELD OF THE INVENTION

The field of the invention is that of electromechanical devices utilizing the generation of acoustic waves in piezoelectric thin layers with a view to producing electrical filter functions.

BACKGROUND

Such devices exhibit operating frequencies of the order of a few hundred MHz to a few GHz, and are used in radiofrequency transmission circuits (portable telephone, radio link, wireless data exchange, etc.), for signal processing or in sensor systems.

More precisely the field of the invention is that of bulk wave, also dubbed "BAW" for "Bulk Acoustic Wave", devices.

A BAW resonator can serve notably to produce bandpass filters beyond a gigahertz for mobile telephone applications for example. Usually, the piezoelectric material is deposited by techniques such as cathodic sputtering. An alternative to deposition is the transfer of monocrystalline layers, this possibly being employed to improve the properties of such resonators.

The advantage is multifold: these materials intrinsically comprise fewer losses (compared with aluminium nitride AlN or zinc oxide ZnO obtained by depositions), can have much greater couplings and, depending on the crystalline orientation, the value of the coupling can be chosen.

The benefits of the transfer of piezoelectric monocrystalline layers for acoustic applications are notably presented in publications by NGK insulator and as described in the article: Y. Osugi, T. Yoshino, K. Suzuki, T. Hirai, Microwave Symp., 873 (2007) as well as in the articles by M. Pijolat, J. S. Moulet, A. Reinhardt, E. Defaÿ, C. Deguet, D. Gachon, B. Ghyselen, M. Aïd, S. Ballandras, IEEE Ultras. Symp., 201 (2008), or in the following articles by J. S. Moulet, M. Pijolat, J. Dechamp, F. Mazen, A. Tauzin, F. Rieutord, A. Reinhardt, E. Defaÿ, C. Deguet, B. Ghyselen, L. Clavelier, M. Aïd, S. Ballandras, C. Mazuré, IEEE IEDM, (2008) or else by M. Pijolat, D. Mercier, A. Reinhardt, E. Defay, C. Deguet, M. Aid, J. S. Moulet, B. Ghyselen, S. Ballandras, IEEE Freq. Contr. Symp., 290 (2009).

Figure 1A:
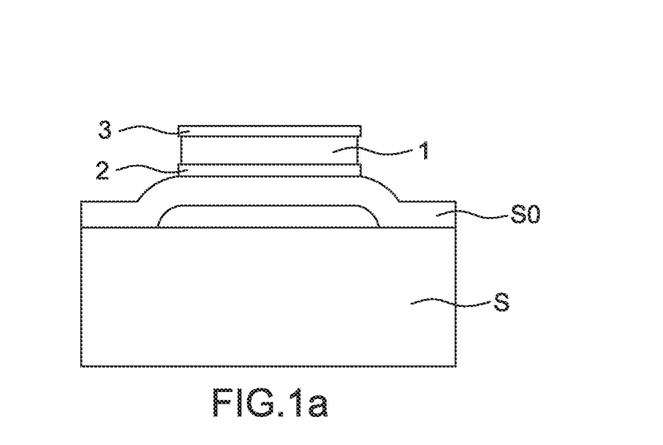
FIGS. 1a and 1b illustrate two types of bulk wave devices according to the known art.
Figure 1B:
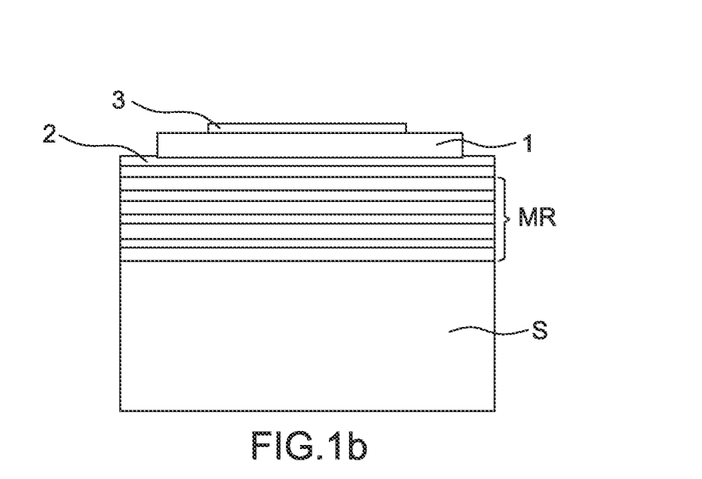

Two types of technologies have been described in patents, making it possible to obtain resonators decoupled from the effect of the substrate, i.e. to manufacture bulk wave devices in suspended films also dubbed "Film Bulk Acoustic Resonators" or "FBARs" as well as "Solidly Mounted Resonators" or "SMRs", exhibiting structures such as those illustrated respectively in FIGS. 1a and 1b. The former comprise suspended thin layers of piezoelectric material 1 inserted between two electrodes 2 and 3 on the surface of a substrate S in which a suspended structure $S_0$ has been produced, the latter can comprise for example Bragg mirrors MR making it possible to confine the bulk waves and thus to decouple them from the effect of the substrate S.

The first technology described in patents US20070200458 and US20070210878A1, consists of bonding followed by thinning of an $LiNbO_3$ substrate down to a micron, the active devices resting on air gaps. Such thinning to below a micron, while preserving great homogeneity thickness-wise during thinning, is very difficult.

The second technology described in patent U.S. Pat. No. 6,767,749 presents various methods for obtaining a monocrystalline thin layer acoustically decoupled from the substrate. This technique is based on the implantation of gaseous ions (typically hydrogen) termed the implantation/fracture technique, the implantation/fracture method making it possible for its part to achieve very low thicknesses that may typically be less than about 0.5 µm but which are limited in respect of greater values to 2 µm with a microelectronics conventional implanter and to a few tens of µm with high-energy implanters. The method of transfer by implantation/fracture is described in detail in the article: "Silicon on insulator material technology", Electronic letters, 31 (14), p 1201-1202 (1995), it allows notably the production of SOI "Silicon On Insulator" substrates. It is used in this patent to transfer the said layer onto a Bragg reflector type stack or else onto cavities.

It is the latter solution which is deemed very difficult because of the technologies to be employed for transfer. A stiffening material is required in order to ensure transfer atop the cavities and may be removed later. During the bonding step, a vacuum must be made in the cavities so as to avoid problems with overpressure during subsequent temperature rise, a delicate step requiring special bonding machines.

The inherent problem with these two technologies remains the difficulty of obtaining the suspended thin layer.

SUMMARY OF THE INVENTION

The present invention overcomes this difficulty by using a so-called sacrificial layer which delimits, once withdrawn after the thin film has been obtained, the cavity required in order to have a bulk wave device of FBAR type.

More precisely, the subject of the present invention is a method for fabricating a bulk wave acoustic resonator (FBAR) comprising at least locally a partially suspended thin layer of piezoelectric material, characterized in that it comprises the following steps:
  the formation of at least one first so-called lower electrode on the surface of a thin layer of piezoelectric material;
  the deposition of a so-called sacrificial layer on the surface of the said thin layer of piezoelectric material and of the said first electrode defining a first set;
  the assembling of the said first set with a second substrate;
  the formation of at least one second electrode termed the upper electrode on the opposite face of the said thin layer of piezoelectric material from the face comprising the said first electrode;
  the elimination of the sacrificial layer so as to unveil the said thin layer of piezoelectric material and the said first electrode and define the bulk wave resonator.

According to a variant of the invention, the method comprises the manufacture of a sacrificial layer feature shrouding the said first electrode.

According to a variant of the invention, the method furthermore comprises an operation of local etching of the thin layer of piezoelectric material so as to allow the elimination of the sacrificial layer.

According to a variant of the invention, the method furthermore comprises the deposition of a planarizing layer on the sacrificial layer shrouding the said first electrode, prior to the assembling of the first set with the second substrate.

According to a variant of the invention, the second substrate comprises at the surface a layer that advantageously may be of the same nature as that of the planarizing layer on the surface of the sacrificial layer.

According to a variant of the invention, the method furthermore comprises the deposition of a protection layer prior to the deposition of the planarizing layer, this protection layer being able advantageously to ensure the function of etching stop layer.

According to a variant of the invention, the method furthermore comprises a step of planarizing the planarizing layer, prior to the assembling operation.

Thus by performing the deposition of a layer encompassing the sacrificial layer and the electrodes, and which can advantageously be planarized, it is possible to undertake planar-planar assembling of very good quality.

According to a variant of the invention, the method comprises the fabrication of the said thin layer of piezoelectric material by the following steps:
    the definition of a thin layer of piezoelectric material within a first piezoelectric material substrate comprising the said first electrode and the sacrificial layer and defining a precursor set;
    the assembling of the said precursor set, first electrode side, on the second substrate;
    the separation of the said first piezoelectric material substrate from the said thin layer of piezoelectric material.

According to a variant of the invention, the definition of the thin layer of first piezoelectric material comprises the implantation of ions in the said first substrate so as to create in the piezoelectric material a buried weak zone defining the thin layer of piezoelectric material.

According to a variant of the invention, the separation is carried out by heat treatment.

According to a variant of the invention, the method comprises:
    a step of assembling a first substrate of wholly or partly piezoelectric material, the said piezoelectric material being covered with the said first electrode and with the sacrificial layer together with the surface of a second substrate;
    a step of thinning the first substrate by lapping and/or polishing so as to define a thin layer of piezoelectric material.

According to a variant of the invention, the assembling is performed by molecular bonding.

According to a variant of the invention, the piezoelectric material is of lithium niobate, lithium tantalate or quartz type.

According to a variant of the invention, the etching of the piezoelectric material layer is performed by photolithography and etching of the layer.

According to a variant of the invention, the sacrificial layer comprises a material of polymer or silicon oxide or metal type, possibly titanium, tungsten or molybdenum.

According to a variant of the invention, the elimination of the sacrificial layer feature is performed by attacking it with acid solution possibly being of hydrofluoric acid or phosphoric acid or Xenon fluoride type.

According to a variant of the invention, the planarizing layer is of silicon nitride, silicon oxide type or a metal of tungsten or aluminium type.

The sacrificial layer and the first planarizing layer can thus consist for example of the same material. The attacking of the layers may be selective or non-selective, in the latter case, the etching time is the determining parameter, selective attack remaining a preferential variant.

According to a variant of the invention, the intermediate layer is of titanium nitride or aluminium nitride type.

According to a variant of the invention, the second substrate is made of material of lithium niobate, lithium tantalate or quartz or silicon type.

According to a variant of the invention, the first and/or the second electrode are made of a metal such as platinum, aluminium or molybdenum or copper or tungsten or chromium or a copper and aluminium alloy or an aluminium and silicon alloy or Ruthenium.

The subject of the invention is also a collective method for fabricating bulk wave resonators (FBAR), each device comprising at least locally a partially suspended thin layer of piezoelectric material, characterized in that it comprises the following steps:
    the formation of a set of first so-called lower electrodes on the surface of a thin layer of piezoelectric material;
    the deposition of a sacrificial layer on the surface of the said thin layer of piezoelectric material and of the said first electrodes defining a first set;
    the assembling of the said first set with a second substrate;
    the formation of a set of second electrodes termed upper electrodes on the opposite face of the said thin layer of piezoelectric material from the face comprising the said first electrodes;
    the elimination of the sacrificial layer so as to unveil the said thin layer of piezoelectric material and the said first electrodes and define the bulk wave resonators.

According to a variant of the invention, the collective method comprises the manufacture of features of sacrificial layer shrouding the said first electrodes.

According to a variant of the invention, the lower and upper electrodes are defined so as to be able to carry out a grating type filtering function.

According to a variant of the invention, the lower and upper electrodes are defined so as to be able to carry out a ladder type filtering function.

BRIEF DESCRIPTION OF THE DRAWINGS

The invention will be better understood and other advantages will become apparent on reading the nonlimiting description which follows and by virtue of the appended figures among which.

DETAILED DESCRIPTION

According to a first variant of the invention, the method comprises the following steps making it possible to produce a device of FBAR type, illustrated by the set of FIGS. 2a to 2h.

Figure 2A:
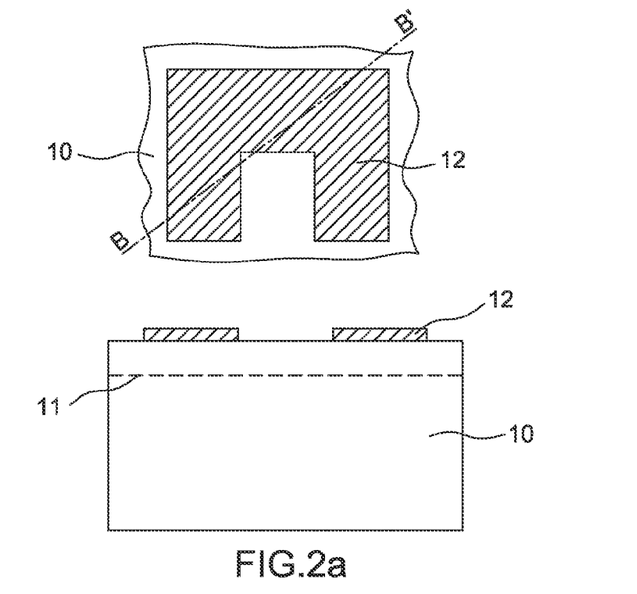
FIGS. 2a to 2h illustrate the various steps of an exemplary method according to the invention.

In a first step illustrated in FIG. 2a, an ion implantation is carried out in a substrate 10 at a certain depth with atoms so as to create a weakened zone 11 with a determined and very homogeneous thickness.

The deposition of a metal layer and photolithography operations are then undertaken, making it possible to define an electrode called a lower electrode 12. FIG. 2a highlights by a view from above the definition of the said lower electrode as well as by a sectional view BB'.

Figure 2B:
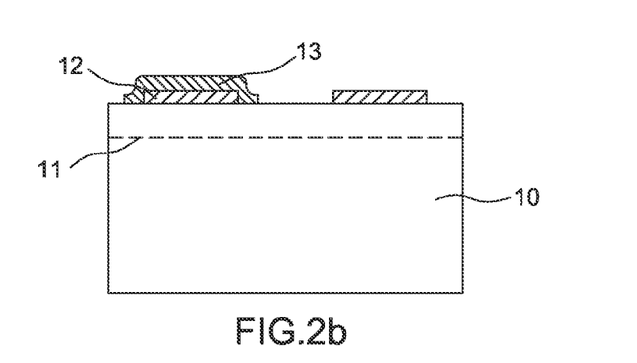

In a second step illustrated in FIG. 2b, the deposition of a sacrificial layer 13 is undertaken on the surface of the substrate 10 covered with the electrode 12. By photolithography steps a feature is defined in the sacrificial layer encompassing the so-called lower electrode defined in the layer 12.

Figure 2C:
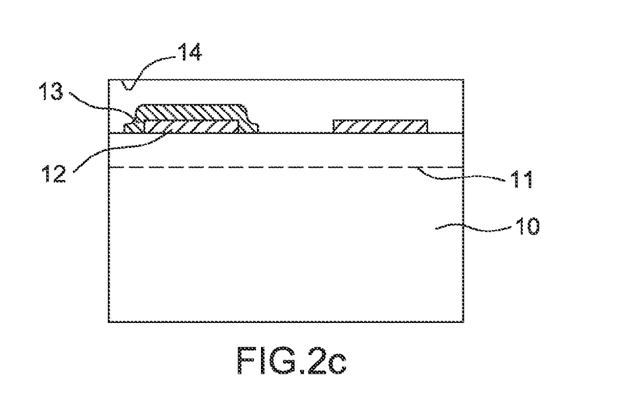

In a third step the deposition of a planarizing layer 14 is undertaken, as illustrated in FIG. 2c. This layer may advantageously be worked by polishing by a method of for example chemico-mechanical type "CMP" as will be described in greater detail in an exemplary fabrication, so as to ensure a very planar surface and allow planar-planar transfer with the second substrate.

Figure 2D:
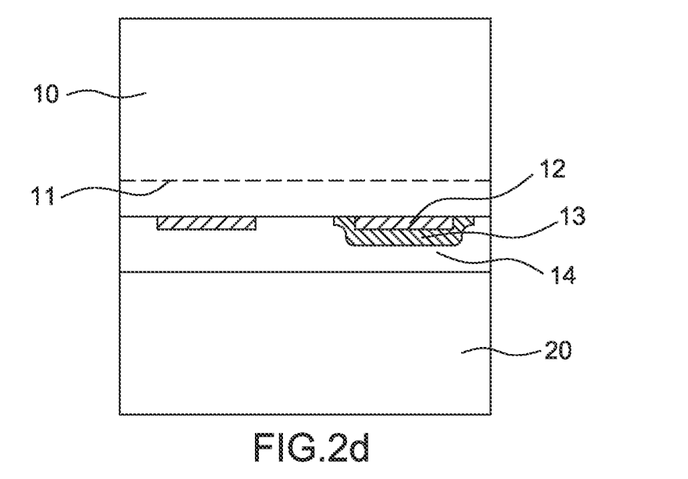
Figure 2E:
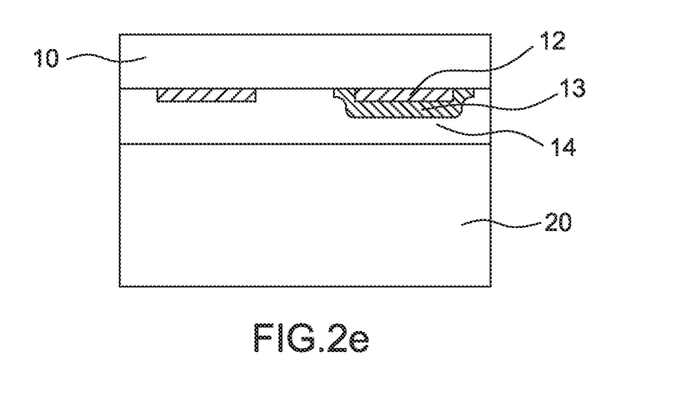

In a fourth step the transfer of the stack previously constructed onto a second substrate 20, placed in contact via the planarizing layer, is undertaken as illustrated in FIG. 2d. Advantageously, this transfer is performed by a molecular bonding operation.

In a fifth step the thinning of the piezoelectric material substrate is undertaken by heat treatment at a temperature typically lying between about 100° C. and 500° C. so as to initiate the transfer of the fine layer of piezoelectric material 10, making it possible to separate the thin layer to be transferred from the remainder of the piezoelectric material substrate. This yields the stack represented in FIG. 2e with the fine layer of piezoelectric material transferred via the planarizing layer and the sacrificial layer feature atop the second substrate 20.

Figure 2F:
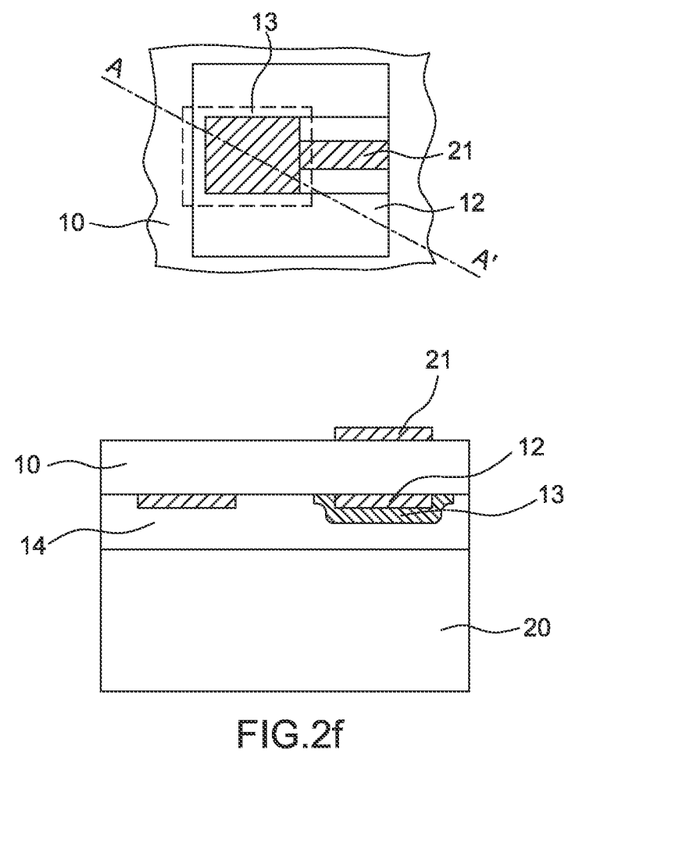

In a sixth step, the upper electrode 21 is produced with the aid of the deposition of a metallization layer and of photolithography operations, as is represented in FIG. 2f (view from above and sectional view AA').

Figure 2G:
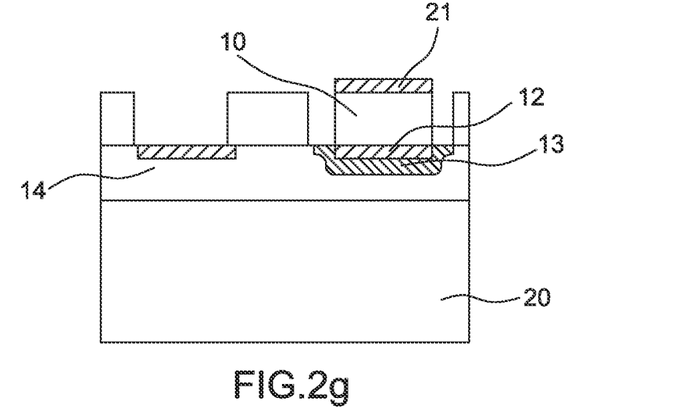

In a seventh step, an operation of partial etching of the fine layer of piezoelectric material is performed, making it possible to define the flanks of the sought-after bulk wave device, as is represented in FIG. 2g.

Figure 2H:
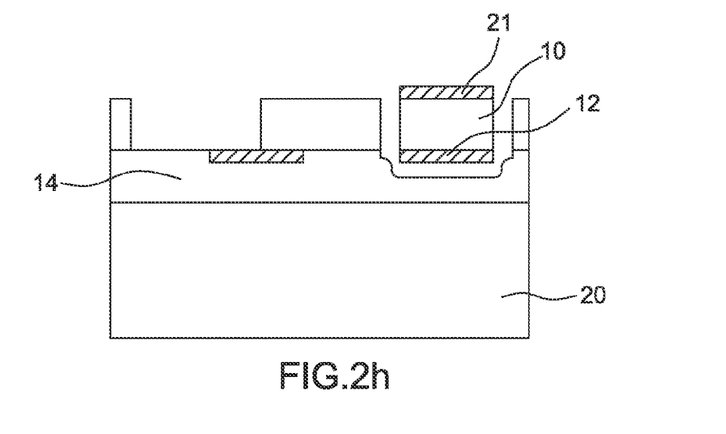

In an eighth step illustrated in FIG. 2h, the attacking of the feature of the sacrificial layer is then undertaken, making it possible to define the suspended thin film of piezoelectric material inserted between two electrodes and which is a constituent of the "FBAR" device.

Figure 3A:
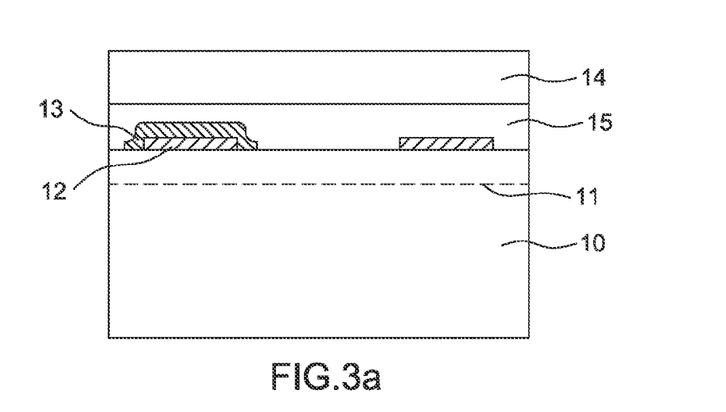
FIGS. 3a and 3b illustrate two specific steps of an exemplary method of the invention.

According to a second variant, the method of the present invention furthermore provides for the deposition of an intermediate layer 15, deposited on the surface of the sacrificial layer 13, as is illustrated in FIG. 3a which incorporates all of the first steps identical to those described in the steps of the first variant illustrated by FIGS. 2a and 2b.

The following steps of this variant of the method are identical to those of the first variant.

During the attacking of the sacrificial layer this intermediate layer is intended not to be attacked completely.

Figure 3B:
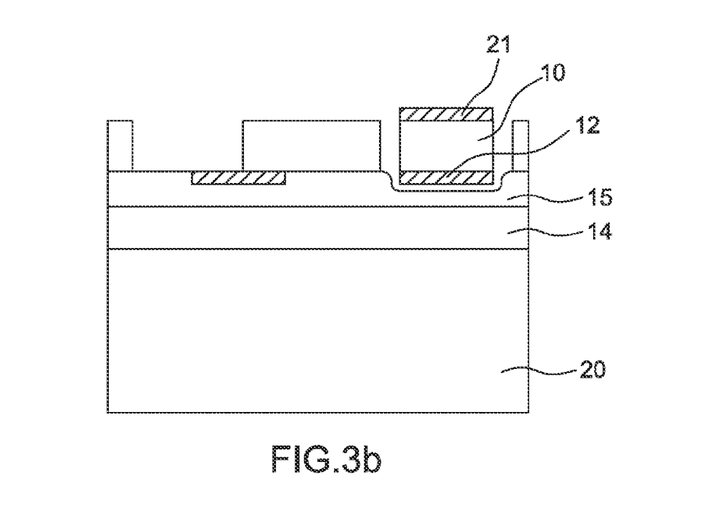

FIG. 3b illustrates this operation of attacking of the sacrificial layer 13, at least partially leaving the intermediate layer 15.

It should be noted that the second substrate 20 may be monolithic or multilayer and in particular, it can comprise on its face placed in contact with the first set, a layer of the same type as the planarizing layer, so as to favour the molecular adhesion of this assembly or else a bonding layer.

Exemplary Embodiment

A first substrate of a monocrystalline piezoelectric material 10 such as lithium niobate, lithium tantalate or quartz is implanted at a certain depth with ions 11 such as Hydrogen or Helium so as to create a weakened zone with a determined and extremely homogeneous thickness. This thickness can vary from a micron to a few tens of nanometers determining the thickness of the thin layer intended to be transferred, as well as the frequency of the resonator.

On this first substrate are thereafter performed the following operations:
- a first operation of photolithography of a metal 12 such as platinum, tungsten, molybdenum or aluminium intended to form the lower electrode whose thickness can vary between a few tens of nanometers and a few hundred nanometers;
- a second operation of photolithography of a sacrificial layer 13 such as a polymer or Silicon oxide intended to constitute the air gap subsequently. This sacrificial layer possesses a thickness of about ten nanometers to several microns.

The deposition of a planarizing layer of material such as silicon nitride, silicon oxide or a metal such as tungsten or aluminium is undertaken thereafter, thus making it possible to entirely cover the previous layers.

A CMP chemical-mechanical polishing type method is then performed on this first substrate so as to obtain a plane oxide layer, whose roughness does not exceed 5 Angströms RMS and is thus ready for the transfer onto a second substrate 20 of a material such as lithium niobate, lithium tantalate or quartz. Generally, the CMP method, the initials standing for "chemical mechanical planarization" or "chemical mechanical polishing", is a process which evens out the reliefs on the layers of silicon oxides, of poly-silicon as well as the metallic layers. It is used to planarize these layers so as to prepare them for the following lithographic steps, thus avoiding the fine-tuning problems related to depth variations during the illumination of the photosensitive resin. It is a very efficacious procedure for the fabrication of electronic circuits with very high integration density. CMP is a process for smoothing and planarizing surfaces combining chemical and mechanical actions, a mixture of chemical etching and of mechanical polishing with free abrasive. Mechanical lapping alone causes too much damage on the surfaces and wet etching alone does not make it possible to obtain good planarization. The chemical reactions being isotropic, they attack the materials equally in all directions. The CMP method exhibits the benefit of combining the two effects at the same time.

The transfer of the substrate 10 and of the layers previously produced is performed onto a second host substrate 20.

An elevation of the temperature of the whole is undertaken so as to create a fracture wave in the plane of the implanted zone culminating in the separation of the fine layer of piezoelectric material and of its substrate.

An operation of photolithography of the upper electrode 21 made of a metal such as platinum, aluminium or molybdenum is then carried out followed by a photolithography of openings in the piezoelectric material. These openings allow access on the one hand to the lower electrode for electrical tests and on the other hand to the sacrificial layer which is thus etched for example by wet solution by means of hydrofluoric acid or phosphoric acid or by means of a vapour phase such as Xenon fluoride or vapour hydrofluoric acid.

It should be noted that when carrying out an exemplary method of the invention according to the second variant described, the intermediate layer can notably be made of material of titanium nitride or aluminium nitride type and have a thickness of between about a nanometer and a hundred nanometers.

To summarize, the benefit of the present invention resides in the combination of the following main characteristics:
the use of a sacrificial layer to carry out the decoupling of the substrate required for a resonator of "FBAR" type;

the employment of a CMP technique on the oxide allowing a planar surface for the operation of obtaining a fine layer of piezoelectric material by ion implantation, a fully mastered operation;

the etching of the piezoelectric layer emerging at one and the same time onto the sacrificial layer and onto the upper electrode.

By virtue of the method of the present invention, it is particularly beneficial to produce in a collective manner a set of resonators of "FBAR" type and thus to be able to produce a grating or ladder type filtering function whose passband is much greater than anything that can be produced today in terms of RF acoustic filters.

The invention claimed is:

1. A method of fabricating a bulk wave acoustic resonator having a partially suspended layer of piezoelectric material, the method comprising the following steps:
    formation of a first electrode on a surface face of the layer of piezoelectric material;
    deposition of a sacrificial layer on the surface face of the layer of piezoelectric material and the first electrode to form a first substrate assembly;
    assembling of the first substrate assembly with a second substrate;
    formation of a second electrode on an opposite face of the layer of piezoelectric material from the surface face comprising the first electrode; and
    elimination of the sacrificial layer so as to partially suspend the layer of piezoelectric material and the first electrode and define the bulk wave acoustic resonator.

2. The method of fabricating a resonator according to claim 1, further comprising:
    manufacture of the said sacrificial layer feature shrouding the said first electrode so as to construct the first substrate assembly.

3. The method of fabricating a resonator according to claim 1, further comprising:
    local etching of the layer of piezoelectric material so as to allow the elimination of the sacrificial layer.

4. The method of fabricating a resonator according to claim 1, further comprising:
    deposition of a planarization layer on the sacrificial layer shrouding the said first electrode, prior to the assembling of the first substrate assembly with the second substrate.

5. The method of fabricating a resonator according to claim 4, in which the second substrate comprises a layer that is of the same nature as that of the planarization layer on the sacrificial layer.

6. The method of fabricating a resonator according to claim 4, further comprising:
    deposition of a protection layer prior to the deposition of the planarization layer.

7. The method of fabricating a resonator according to claim 4, further comprising;
    planarizing the planarization layer, prior to the assembling operation.

8. The method of fabricating a resonator according to claim 1, further comprising:
    fabrication of the layer of piezoelectric material by the following steps:
        defining the layer of piezoelectric material within a first piezoelectric material substrate comprising the said first electrode and the sacrificial layer and defining a precursor set;
        assembling of the precursor set, first electrode side, on the second substrate;
        separating the first piezoelectric material substrate from the layer of piezoelectric material.

9. The method of fabricating a resonator according to claim 8, wherein defining the layer of piezoelectric material comprises the implantation of ions in the first piezoelectric material substrate to create in the first piezoelectric material substrate a buried weak zone defining the layer of piezoelectric material.

10. The method of fabricating a resonator according to claim 8, wherein separation of the first piezoelectric material substrate from the layer of piezoelectric material is carried out by thermal treatment.

11. The method of fabricating a resonator according to claim 1, further comprising:
    thinning the first substrate assembly by lapping and/or polishing so as to define the layer of piezoelectric material.

12. The method of fabricating a resonator according to claim 1, wherein the assembling is performed by molecular bonding.

13. The method of fabricating a resonator according to claim 1, wherein the piezoelectric material is of lithium niobate, lithium tantalite or quartz type.

14. The method of fabricating a resonator according to claim 13, wherein the etching of the piezoelectric material layer is performed by photolithography and etching of the layer.

15. The method of fabricating a resonator according to claim 1, wherein the sacrificial layer comprises a material of polymer or silicon oxide or a metal type of titanium, tungsten or molybdenum.

16. The method of fabricating a resonator according to claim 15, wherein the elimination of the sacrificial layer is performed by attacking the sacrificial layer with an acid solution of hydrofluoric acid or phosphoric acid, or Xenon fluoride type.

17. The method of fabricating a resonator according to claim 4, wherein the planarizing layer is of silicon nitride, silicon oxide type or a metal of tungsten or aluminium type.

18. The method of fabricating a resonator according to claim 6, wherein the protection layer is of titanium nitride or aluminium nitride type.

19. The method of fabricating a resonator according to claim 1, wherein the second substrate is made of material of lithium niobate, lithium tantalate or quartz type.

20. The method of fabricating a resonator according to claim 1, wherein the first or the second electrode are made of a metal comprising platinum, aluminium, molybdenum, copper, tungsten or chromium, a copper and aluminium alloy, a silicon and aluminium alloy, or Ruthenium.

21. A method for fabricating a set of bulk wave acoustic resonators, each resonator having a partially suspended layer of piezoelectric material, the method comprising the following steps:
    formation of a plurality of first electrodes on a surface face of the layer of piezoelectric material;
    deposition of a sacrificial layer on the surface face of the layer of piezoelectric material and the first electrodes to form a first substrate assembly;
    assembling of the first substrate assembly with a second substrate;
    formation of a plurality of second electrodes on an opposite face of the layer of piezoelectric material from the surface face comprising the first electrodes;
    elimination of the sacrificial layer so as to partially suspend the layer of piezoelectric material and the plurality of first electrodes to define the bulk wave resonators.

22. The method for fabricating a set of bulk wave acoustic resonators according to claim 21, in which the plurality of first electrodes and the plurality of second electrodes are defined so as to be able to carry out a lattice type filtering function.

23. The method for fabricating a set of bulk wave acoustic resonators according to claim 21, in which the plurality of first electrodes and the plurality of second electrodes are defined so as to be able to carry out a ladder type filtering function.

* * * * *